US006992521B2

(12) United States Patent
Concord

(10) Patent No.: US 6,992,521 B2
(45) Date of Patent: Jan. 31, 2006

(54) SWITCH IN BIPOLAR TECHNOLOGY

(75) Inventor: Joël Concord, Tours (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/863,911

(22) Filed: Jun. 9, 2004

(65) Prior Publication Data

US 2004/0251950 A1 Dec. 16, 2004

(30) Foreign Application Priority Data

Jun. 12, 2003 (FR) .................................. 03 07087

(51) Int. Cl.
*H03K 17/06* (2006.01)

(52) U.S. Cl. ...................... 327/490; 327/484; 327/327; 327/540

(58) Field of Classification Search ................ 327/312, 327/313, 327, 411, 478, 484, 486, 488, 541, 327/546

See application file for complete search history.

(56) References Cited

U.S. PATENT DOCUMENTS 4,645,999 A 2/1987 Szepesi
5,125,112 A * 6/1992 Pace et al. ................. 340/7.32
5,661,395 A 8/1997 Johnson et al.
6,201,381 B1 * 3/2001 Yasuda ....................... 323/315
6,541,949 B2 * 4/2003 Sirito-Olivier .............. 323/315

OTHER PUBLICATIONS

French Search Report from corresponding French National Application No. 0307087, filed Jun. 12, 2003.
Patent Abstracts of Japan, vol. 013, No. 142 (E-739), Apr. 7, 1989 & JP 63 304705 A (Toshiba Corp.).

* cited by examiner

*Primary Examiner*—Terry D. Cunningham
*Assistant Examiner*—Thomas Hiltunen
(74) *Attorney, Agent, or Firm*—Lisa K. Jorgenson; James H. Morris; Wolf, Greenfield & Sacks, P.C.

(57) ABSTRACT

A switch in bipolar technology including a first main transistor of a first type connecting an input terminal, intended to be connected to a first terminal of application of a D.C. supply voltage, to an output terminal intended to be connected to a load to be supplied; a second bipolar transistor of the same type as the first one, connected between the input terminal and an input of a current mirror circuit having a copying output connected to the base of the first transistor, the bases of the first and second transistors being interconnected and the first transistor having an emitter surface area greater than the second one; and a circuit for biasing the second transistor including the copying of the output voltage of the switch on the collector of this second transistor.

9 Claims, 2 Drawing Sheets

SWITCH IN BIPOLAR TECHNOLOGY

BACKGROUND OF THE INVENTION

1. Field of the Invention

The present invention relates to an integrated switch formed of bipolar transistors.

2. Discussion of the Related Art

The simplest way of forming a switch in bipolar technology is to use a transistor in saturated state, the voltage drop thereacross (collector-emitter) being also minimum. The maximum possible power can then be transferred to a load to be supplied, series-connected, to this bipolar transistor. To place a transistor in saturation state, a given base current must be applied thereto so that the gain (ratio of the collector current to the base current) is forced to a value smaller than the minimum gain of this transistor in linear state.

A difficulty lies in the fact that, by setting a determined base current, the intrinsic switch power consumption (linked to its base current) remains constant, even for a vertical load. This especially makes this type of assembly poorly adapted to low-consumption applications.

To overcome this disadvantage, switches in bipolar technology enabling regulation of the base current of the main transistor according to the current surged by the load have already been provided.

FIG. 1 shows a conventional example of such a so-called adaptive switch.

In the illustrated example, main transistor 1 is a PNP transistor connected, in series with a load Q, between an input terminal IN on which will be applied a D.C. supply voltage Vcc and a terminal M representing the circuit's electric ground. The emitter of transistor 1 is connected to terminal IN forming an input terminal of the switch and its collector defines an output terminal OUT, connected to load Q having its other terminal at ground M.

The rest of the assembly is formed by the adaptive control circuit. This circuit is based on the copying by a transistor 2 (here, of type PNP) of a fraction of the current flowing through transistor 1. The emitter of transistor 2 is connected to terminal IN (and thus to the emitter of transistor 1), and its base is connected to that of transistor 1.

The collector of transistor 2 is connected to a current mirror, formed of two NPN-type transistors 3 and 4 (respectively defining the source transistor and the copying transistor of the mirror) having their emitters connected to ground and their respective bases interconnected to the collector of transistor 3 (and thus to the collector of transistor 2). The bases of transistors 1 and 2 are further connected to the current mirror output, on the collector of transistor 4. A biasing resistor R connects terminal IN to the bases of transistors 3 and 4.

The current drawn from the base of transistor 1 by current mirror 3–4 is $Ib=Ic/(N-1)$—where N represents the ratio of the emitter surface areas of transistors 1 and 2—and forces transistor 1 into a saturation state with a forced gain equal to $\beta f=Ic/Ib=N-1$. Thus, if N is chosen so that gain $\beta f$ is smaller than the minimum gain of transistor 1 in linear state, the the saturation of this transistor and the switch operation of the assembly are ensured.

A NPN-type transistor 5, controlled by a two-state circuit activation signal ON/OFF, connects the collector of transistor 2 to ground. When transistor 5 conducts, the current provided by transistor 2 flows to ground and no current is then drawn from the base of transistor 1, which ensures its blocking.

A disadvantage of the structure of FIG. 1 is that transistors 1 and 2 have, between their respective collectors and emitters, different biasings. Indeed, transistor 1 operates in a saturated state with a low collector-emitter voltage while transistor 2 (unsaturated) sees across its terminals a much greater collector-emitter voltage. This collector-emitter voltage difference may induce a current copying error between the two transistors and then cause a significant increase in the switch power consumption on-load as well as in the idle state. This disadvantage more specifically appears in integrated technology where the small dimension of the components makes their parameters more sensitive to biasing conditions.

In practice, this overconsumption phenomenon linked to the difference in biasing conditions tends to be enhanced by the increase in the component's operating temperature.

SUMMARY OF THE INVENTION

The present invention aims at providing a switch in bipolar technology overcoming the disadvantages of known switches. More specifically, the present invention aims at providing a switch in which the current-copying ratio is independent from a possible difference in the collector-emitter voltage between the mirror transistors.

The present invention also aims at providing a solution which is particularly adapted to low-consumption systems in integrated form.

On this regard, the present invention aims at providing a solution compatible with the adding of an output current limiting function for, among others, protecting the circuit against output short-circuits or limiting the maximum current in load Q.

To achieve these and other objects, the present invention provides a switch in bipolar technology, comprising:

a first main transistor of a first type connecting an input terminal, intended to be connected to a first terminal of application of a D.C. supply voltage, to an output terminal intended to be connected to a load to be supplied;

a second bipolar transistor of the same type as the first one, connected between said input terminal and an input of a current mirror circuit having a copying output connected to the base of the first transistor, the bases of the first and second transistors being interconnected and the first transistor having an emitter surface area greater than the second one; and a circuit for biasing the second transistor consisting in the copying of the output voltage of the switch on the collector of this second transistor.

According to an embodiment of the present invention, said current mirror circuit is formed of a third bipolar transistor of a second type and of a fourth bipolar transistor of the second type connecting the base of the first transistor to a second terminal of application of the supply voltage, the bases of the third and fourth transistors being interconnected to the collector of the third transistor connecting the collector of the second transistor via a fifth bipolar transistor of the first type belonging to the biasing circuit.

According to an embodiment of the present invention, the fourth transistor has an emitter surface area greater than that of the third transistor.

According to an embodiment of the present invention, the biasing circuit further comprises a sixth transistor of the second type connected between said output terminal by its emitter and a seventh bipolar transistor of the second type mirror-assembled on said third and fourth transistors, the emitter surface area of the seventh transistor being, preferably, identical to that of the third transistor.

According to an embodiment of the present invention, a starting current source connects the base of the first transistor to the second terminal of application of the supply voltage.

According to an embodiment of the present invention, a start-up aid circuit injects a current on the collector of the second transistor, the start-up aid circuit being preferably formed of a resistor in series with an eighth transistor of the first type connected between the input terminal and said collector of the second transistor, the base of the eighth transistor being connected to the base of the first transistor to inject a current which is an image of the output current.

According to an embodiment of the present invention, a circuit for limiting the internal current formed, preferably, of a resistor interposed between the collectors of the fifth and third transistors, and of a ninth transistor for branching the current to ground, is provided.

According to an embodiment of the present invention, the transistors of the first type are PNP transistors, the transistors of the second type being NPN transistors.

According to an embodiment of the present invention, the transistors of the first type are NPN-type transistors, the transistors of the second type being PNP-type transistors.

The foregoing and other objects, features, and advantages of the present invention will be discussed in detail in the following non-limiting description of specific embodiments in connection with the accompanying drawings.

DETAILED DESCRIPTION

Figure 1:
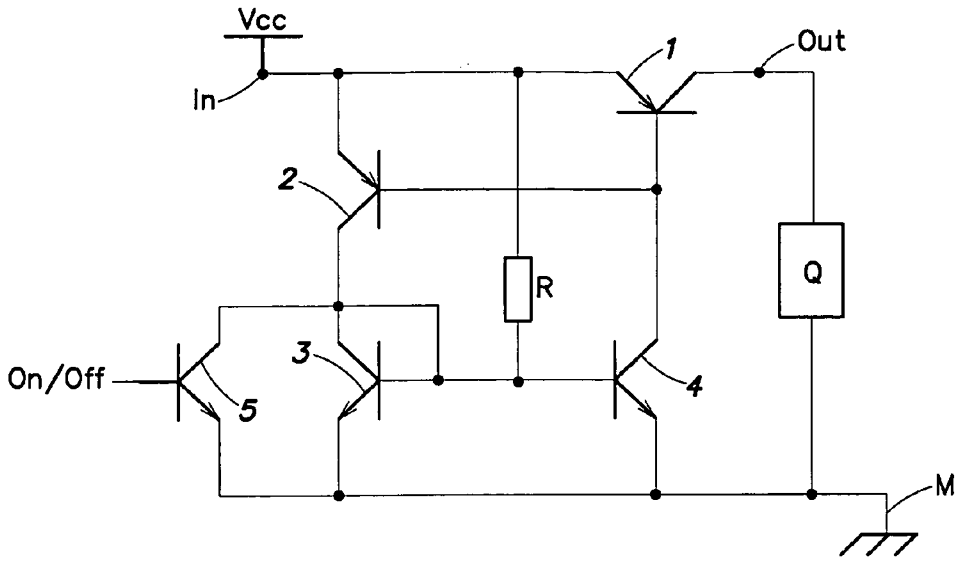
FIG. 1 (Prior Art)
FIG. 1, previously described, is intended to show the state of the art and the problem to solve.

The same elements have been referred to with the same reference numerals in the different drawings. For clarity, only those circuit components that are necessary to the understanding of the present invention have been shown in the drawings and will be described hereafter. In particular, other components may be added to the switch according to the present invention to ensure other functions.

Figure 2:
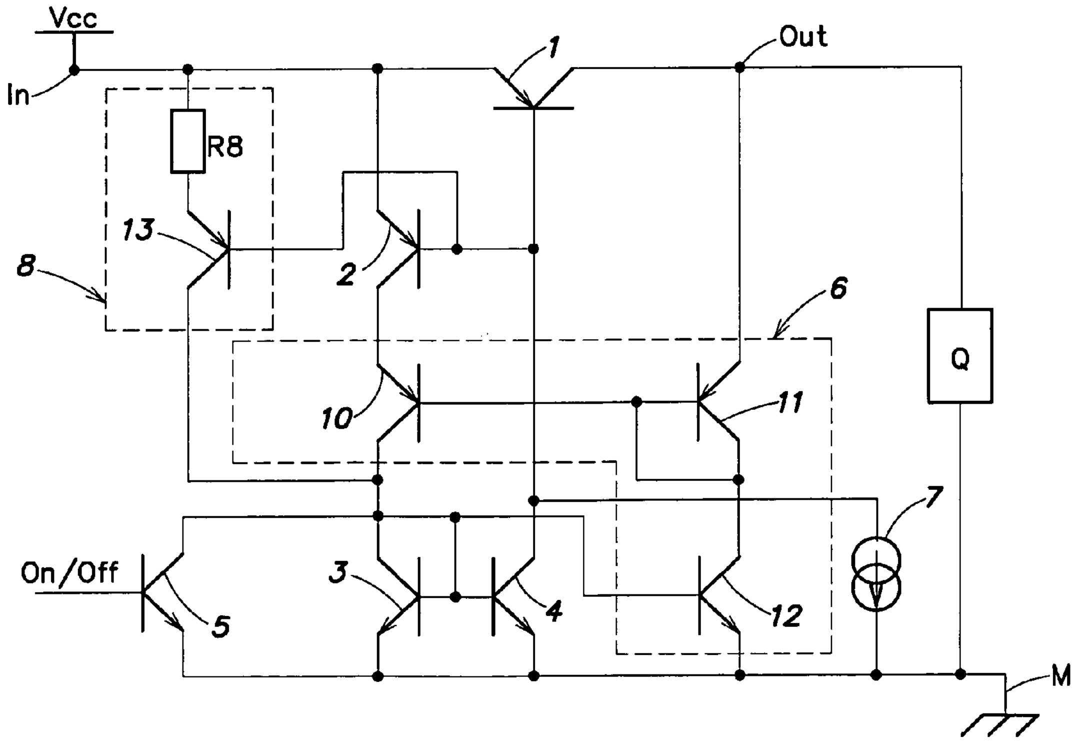
FIG. 2 shows a first embodiment of a switch according to the present invention.

FIG. 2 shows the electric diagram of a switch according to an embodiment of the present invention.

As previously, this switch comprises a main transistor 1 (here, PNP) between two terminals IN and OUT of the circuit. In integrated technology, this PNP transistor will preferentially be of an isolated type, that is, a bipolar component for which the parasitic elements that conduct in saturation mode a leakage current in the substrate will have been insensitized (for example, a transistor in an isolated pocket). Terminal IN is intended to receive a positive supply voltage Vcc while terminal OUT is intended to be connected to a load Q having its other terminal connected to ground M (or to a supply voltage more negative than voltage Vcc).

Still similarly to known circuits, a current mirror assembly that copies the base current of transistor 1 is provided. There thus is a transistor 2 of the same type as transistor 1, the emitter of which is connected to terminal IN, having its base connected to the base of transistor 1, as well as two NPN-type transistors 3 and 4 having their bases interconnected to the collector of transistor 3 and having their emitters connected to ground, the collector of transistor 4 being further connected to the base of transistor 1. A turn-on/turn-off transistor 5 receiving on its base an ON/OFF signal has its collector connected to the collector of transistor 3 and its emitter connected to ground.

According to the present invention, the collector of transistor 2 is not directly connected to the collector of transistor 3 but is connected thereto via a transistor 10, of the same type as transistors 1 and 2 (in the example, PNP), belonging to a circuit 6 for biasing transistor 2 to the same voltage as transistor 1. Circuit 6 also comprises a PNP-type transistor 11 assembled as a voltage follower and an NPN-type transistor 12 mirror assembled on transistors 3 and 4, transistors 11 and 12 being in series between terminal OUT and the ground. More specifically, the emitter of transistor 11 is connected to terminal OUT and its collector is connected to the collector of transistor 12 having a grounded emitter. The base of transistor 11 is connected to its collector and to the base of transistor 10 having its emitter connected to the collector of transistor 2 and having its collector connected to the collector of transistor 3. Finally, the base of transistor 12 is connected to the bases of transistors 3 and 4.

Transistors 10 and 11 are sized so that the ratio of their emitter surface areas is equal to the ratio of the currents flowing therethrough, that is according to the size ratio of transistors 3 and 12. Thus, their base-emitter voltages are equal. As a result, the collector-emitter voltages of transistors 1 and 2 are made identical. Transistor 2 is now biased similarly to transistor 1, the copying ratio is no longer affected by a difference in the collector-emitter voltage of these two transistors and thus remains constant and equal to 1/(N−1), where N shows the ratio of the emitter surface areas of transistors 1 and 2.

Transistors 3 and 4 also have different emitter surface areas, transistor 4 having an emitter surface area greater than transistor 3, the ratio of the surface area of transistor 4 to that of transistor 3 is designated hereafter as M. However, transistor 12 has, preferably, the same size as transistor 3.

To enable starting of the circuit upon power-on, a current source 7 connects the base of transistor 1 to ground to draw current from this base at the starting. The simplest way of forming this current source is a resistor. Preferably, this resistor is sized to draw a pre-biasing current from transistor 1 on the order of a few microamperes. As an alternative, current source 7 is formed by a transistor assembly.

As a soon as the starting has been performed, the current provided by transistor 1 to the load after its pre-biasing is amplified by the positive feedback loop internal to the structure, to the quiescent value corresponding to output voltage $V_{out}$ divided by the impedance of load Q.

The presence of circuit 6 induces a response time of the switch when load Q varies significantly. Indeed, when the switch is active and in the absence of an output load, the internal currents are extremely low, or even zero, and transistor 10 is almost non-conductive. Accordingly, the current in transistor 1 remains limited to the product of the current provided by source 7 multiplied by the gain of transistor 1 for a longer or shorter delay, necessary for the leakage current to start the structure and enable the switch to provide the current to the load.

According to a preferred embodiment of the present invention, this response time is decreased by injecting a low current, which is an image of the output current, directly on the collector of transistor 3. A current injection circuit 8 formed of a resistor R8 in series with a PNP-type transistor 13 between terminal IN and the collector of transistor 3 is thus provided. The base of transistor 13 is connected to the base of transistor 2. The presence of circuit 8 does not cause a power consumption problem, despite the fact that transistor 13 has a collector-emitter voltage different from that of transistor 1. Indeed, resistor R8, which preferably has a high value (from a few kiloohms to a few tens of kiloohms) induces a limitation of the current in transistor 13 making the current provided by said transistor negligible with respect to the current in transistor 2 in normal operation.

Taking the example of a dimension ratio (of emitter surface areas) between transistors 4 and 3 of M (transistor 12 being of same size as transistor 3), the saturation condition of transistor 1 becomes:

$$\beta_f=(N-M)/M$$

where $\beta_f$ designates the forced gain of transistor 1 that must be smaller than its minimum gain in linear state.

With these notations, the ratio between the input and output currents follows the following relation:

$$I_{IN}=I_{OUT}*(1+(M+2)/(N-M)).$$

The internal current consumed by the switch is then equal to $I_{OUT}$*(M+2)/(N−M) and switch efficiency is equal to (N−M)/(N+2).

From the preceding relations, it can be seen that ratio M provides an additional degree of freedom to adjust the forced gain of transistor 1.

An advantage of the switch of the present invention is that it enables saturation of main transistor 1 whatever the conditions (temperature, component features, output load).

Another advantage of the present invention is that the switch power consumption is proportional to the output current and that it generates a low quiescent current, which makes the structure compatible with low-consumption applications.

Another advantage of the present invention is that the structure is compatible with low-voltage applications (up to approximately 1.5 V) due to the small number of base-emitter voltages between the supply lines.

Another advantage of this switch is that it is integrable on a chip in bipolar technology.

Figure 3:
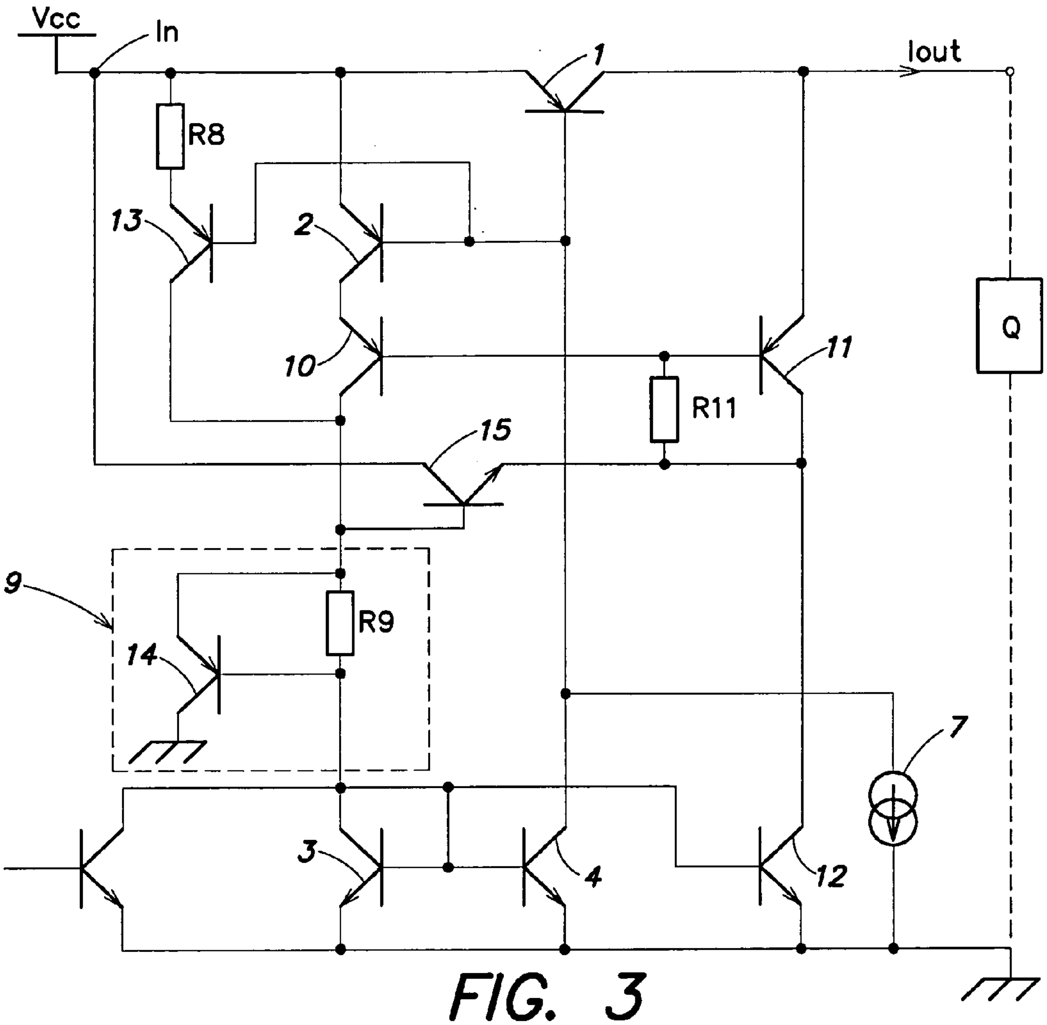
FIG. 3 shows a second embodiment of a switch according to the present invention, equipped with a circuit for limiting the internal current.

FIG. 3 shows another embodiment of the switch of the present invention, equipped with an internal current-limiting circuit 9. The structure of FIG. 3 uses the same elements as those shown in FIG. 2.

According to this embodiment, a current-limiting resistor R9 is interposed between the collector of transistor 10 and that of transistor 3. This resistor is associated with a PNP-type transistor 14 having its emitter connected to the collector of transistor 10 and having its base connected to the collector of transistor 3, the collector of transistor 14 being grounded. Circuit 9 limits the output current of the switch to a value $I_{LIM}$ approximately equal to (N/R9)*VBe14, where VBe14 represents the base-emitter voltage of transistor 14. Indeed, transistor 14 becomes progressively conductive and branches to ground part of the current provided by transistor 10 as soon as the output current approximately reaches the above limiting value. Accordingly, output current $I_{OUT}$ of the device is approximately regulated to value $I_{LIM}$.

Another modification with respect to the circuit of FIG. 2 is the adding of an NPN-type transistor 15 connecting terminal IN (by its collector) to the collector of transistor 11 (by its emitter) and having its base connected to the collector of transistor 10. The function of transistor 15 is to divert the current absorbed by transistor 12 through another path than transistor 10 when the limitation is active. Indeed, when the current is limited, output voltage $V_{OUT}$ is no longer controlled by input voltage $V_{IN}$ (Vcc) decreased by the voltage drop in transistor 1, but is controlled by the load ($V_{OUT}=R_Q*I_{IN}$, where $R_Q$ shows the resistance of load Q). The output voltage may thus drop to very low, or even zero voltages in case of an output short-circuit. In such conditions, transistor 11 blocks (is non-conducting) and it is thus necessary to have the current absorbed by transistor 12 flow through another path than through the base of transistor 10 to avoid affecting the current originating from transistor 2 and, accordingly, the value of the limiting current.

When transistor 10 starts saturating under the effect of an increase in its base current, the collector-emitter voltage of transistor 10 decreases and causes the increase of the base-emitter voltage of transistor 15, which results in its turning-on, which thus enables transistor 12 to draw its collector current not through the base of transistor 10 but through transistor 9, with no significant impact upon the current limitation.

FIG. 3 further illustrates an alternative that comprises replacing the short-circuit of the base and collector of transistor 11 such as shown in FIG. 2 with a resistor R11. The presence of resistor R11 enables advancing the time when transistor 15 starts conducting without it being necessary to reach too large a saturation of transistor 10.

Figure 4:
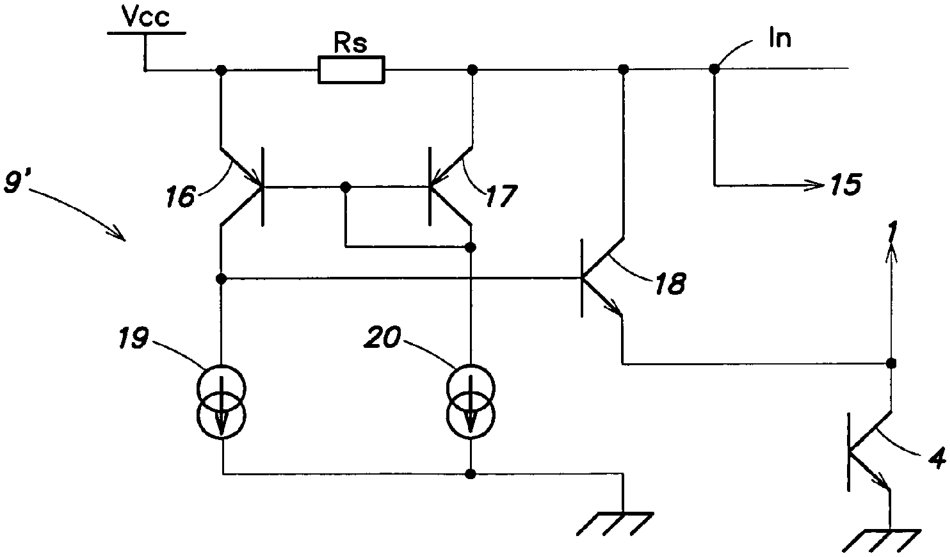
FIG. 4 illustrates an alternative embodiment of a circuit for limiting the internal current.

FIG. 4 illustrates an alternative embodiment of a current-limiting circuit 9'.

As compared to the embodiment of FIG. 3, this alternative comprises removing circuit 9 (and thus directly connecting the collector of transistor 10 to the collector of transistor 3) and connecting a device 9' upstream of terminal IN. More specifically, a shunt resistor Rs is interposed between the terminal of application of voltage Vcc and terminal IN. Two PNP-type transistors 16 and 17 are mirror-connected around resistor Rs, the emitter of transistor 16 being connected to terminal Vcc while the emitter of transistor 17 is connected to terminal IN, the respective collectors of transistors 16 and 17 being connected to two current sources 19 and 20 of same value, preferentially formed by a transistor assembly of current-mirror type, and their base being interconnected to the collector of transistor 17. Further, the collector of transistor 16 is connected to the base of an NPN transistor 18 having its collector connected to terminal IN and having its emitter connected to the collector of transistor 4. The rest of the circuit of FIG. 3 has not been shown in FIG. 4.

The limiting current of circuit 9' is set by the ratio of the emitter surface areas of transistors 16 and 17. By setting this ratio to P, the limiting current is on the order of Vt*log(P)/Rs, where Vt designates the thermal potential (approximately 26 mV at 27° C.).

Of course, the present invention is likely to have various alterations, modifications, and improvements which will readily occur to those skilled in the art. In particular, the dimensions to be given to the various transistors and resistors are within the abilities of those skilled in the art based on the functional indications given hereabove and on the application.

Further, it should be noted that the structure provided by the present invention is dual, that is, it may apply to a negative voltage Vcc by replacing all the PNP transistors with NPN transistors and all the NPN transistors with PNP transistors.

Further, the adding of circuit 8 of protection against short-circuits, of current-limiting circuit 9, or of diversion transistors 15, remains optional depending on the application.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A switch in bipolar technology, comprising:

a first main transistor of a first type connecting an input terminal, intended to be connected to a first terminal of application of a D.C. supply voltage, to an output terminal intended to be connected to a load to be supplied;

a second bipolar transistor of the same type as the first one, connected between said input terminal and an input of a current mirror circuit having a copying output connected to the base of the first transistor, the bases of the first and second transistors being interconnected and the first transistor having an emitter surface area greater than the second one;

further comprising a circuit for biasing the second transistor comprising in the copying of the output voltage of the switch on the collector of the second transistor.

2. The switch of claim 1, wherein said current mirror circuit is formed of a third bipolar transistor of a second type and of a fourth bipolar transistor of the second type connecting the base of the first transistor to a second terminal of application of the supply voltage, the bases of the third and fourth transistors being interconnected to the collector of the third transistor connecting the collector of the second transistor via a fifth bipolar transistor of the first type belonging to the biasing circuit.

3. The switch of claim 2, wherein the fourth transistor has an emitter surface area greater than that of the third transistor.

4. The switch of claim 2, wherein the biasing circuit further comprises a sixth transistor of the second type connected between said output terminal by its emitter and a seventh bipolar transistor of the second type mirror-assembled on said third and fourth transistors, the emitter surface area of the seventh transistor being, preferably, identical to that of the third transistor.

5. The switch of claim 2, wherein a starting current source connects the base of the first transistor to the second terminal of application of the supply voltage.

6. The switch of claim 2, wherein a start-up aid circuit injects a current on the collector of the second transistor, the start-up aid circuit being preferably formed of a resistor in series with an eighth transistor of the first type connected between the input terminal and said collector of the second transistor, the base of the eighth transistor being connected to the base of the first transistor to inject a current which is an image of the output current.

7. The switch of claim 2, wherein a circuit for limiting the internal current formed, preferably, of a resistor interposed between the collectors of the fifth and third transistors, and of a ninth transistor (14) for branching the current to ground, is provided.

8. The switch of claim 1, wherein the transistors of the first type are PNP transistors, the transistors of the second type being NPN transistors.

9. The switch of claim 1, wherein the transistors of the first type are NPN-type transistors, the transistors of the second type being PNP-type transistors.

* * * * *

UNITED STATES PATENT AND TRADEMARK OFFICE

CERTIFICATE OF CORRECTION

PATENT NO. : 6,992,521 B2
DATED : January 31, 2006
INVENTOR(S) : Joël Concord

It is certified that error appears in the above-identified patent and that said Letters Patent is hereby corrected as shown below:

Column 1,
Line 59, should read:
-- than the minimum gain of transistor 1 in linear state, the --.

Signed and Sealed this

Twenty-eighth Day of March, 2006

JON W. DUDAS
*Director of the United States Patent and Trademark Office*